United States Patent
Takanashi et al.

(10) Patent No.: US 7,172,656 B2
(45) Date of Patent: Feb. 6, 2007

(54) DEVICE AND METHOD FOR MEASURING POSITION OF LIQUID SURFACE OR MELT IN SINGLE-CRYSTAL-GROWING APPARATUS

(75) Inventors: Keiichi Takanashi, Tokyo (JP); Nobumitsu Takase, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 271 days.

(21) Appl. No.: 10/822,662

(22) Filed: Apr. 13, 2004

(65) Prior Publication Data

US 2004/0221794 A1 Nov. 11, 2004

(30) Foreign Application Priority Data

May 6, 2003 (JP) .............................. 2003-127968

(51) Int. Cl.
*C30B 15/26* (2006.01)

(52) U.S. Cl. .............................. 117/14; 117/15; 117/16; 117/213; 117/214

(58) Field of Classification Search ................... 117/14, 117/15, 16, 213, 214
See application file for complete search history.

(56) References Cited

FOREIGN PATENT DOCUMENTS

| EP | 454389 | * | 10/1991 |
|----|--------|---|---------|
| JP | 63-21280 | * | 1/1988 |
| JP | 63-100097 | * | 5/1988 |
| JP | 2-102187 | | 4/1990 |
| JP | 5-294785 | | 11/1993 |
| JP | 63-238430 | | 4/1998 |
| JP | 10-226592 | * | 8/1998 |

* cited by examiner

*Primary Examiner*—Robert Kunemund
(74) *Attorney, Agent, or Firm*—Bacon & Thomas, PLLC

(57) ABSTRACT

In a device and a method for measuring the position of the liquid surface of a melt while a single crystal is being pulled, two measuring-lines are defined in an image of a fusion ring which is captured by means of a two-dimensional CCD camera, the intersections of the respective measuring lines and the fusion ring, on the opposite sides of the fusion ring, are detected, and the central position of the single crystal is calculated based on the intervals between the intersections on the opposite sides of the fusion ring, whereby the position of the liquid surface of the melt is determined.

12 Claims, 6 Drawing Sheets

US 7,172,656 B2

DEVICE AND METHOD FOR MEASURING POSITION OF LIQUID SURFACE OR MELT IN SINGLE-CRYSTAL-GROWING APPARATUS

CROSS-REFERENCE TO RELATED APPLICATION

This application claims, under 35 USC 119, priority of Japanese Application No. 2003-127968 filed May 6, 2003.

BACKGROUND OF THE INVENTION

1. Field of the Invention

The present invention relates to a device and a method for measuring the position of the liquid surface of a melt in a process of pulling a single crystal of semiconductor material by the Czochralski method (hereinafter, abbreviated as the CZ method).

2. Description of the Related Art

A variety of methods are used for growing of single crystals of semiconductor materials. The CZ method is one of the methods. FIG. 6 is a cross-sectional view which schematically shows an apparatus for growing a single crystal according to the CZ method. Referring to FIG. 6, a seed crystal 5a hung on a wire 5c at the end of a seed crystal holder 5b is caused to contact the liquid surface 9 of a melt 2 of single crystal which is contained in a crucible 1. Thereafter, the wire 5c is raised by means of a raising device 5d while the crucible 1 and the raising device 5d are rotated around an axis 5 in opposite directions, and the melt 2 is solidified. Thus, a single crystal 4 is grown into a columnar shape.

To keep the amount of heat, which is applied to the melt 2 with a heater 3, constant in the above-described process, the crucible 1 is raised so that the liquid surface 9 of the melt 2 and the heater 3 are kept in a fixed positional relationship. According to a known technique, the volume of the melt which decreases while a single crystal is being pulled is calculated. The raising amount of the crucible is calculated based on the decrease in volume of the melt and the inside diameter of the crucible. However, the decrease in volume of the melt obtained by the calculation has an error due to the variations in the size of the inside diameter of the crucible, measurement errors, and so forth. In particular, the size of the crucible varies because the crucible is placed in a high temperature environment. Thus, the raising amount of the crucible calculated in the above-described way has an error. As a result, the liquid surface of the melt and the heater can not be kept in a fixed relationship. If the position of the liquid surface of a melt is not kept constant with respect to the heater, heat hysteresis of the grown single crystal will be changed. As a result, crystal defects or the like are generated. Thus, single crystals with sufficient quality cannot be produced.

Heretofore, several methods for measuring the position of the liquid surface of a melt while a single crystal is being pulled have been proposed.

One of the methods is optical trigonometry using a laser beam. According to optical trigonometry, a laser beam is caused to be incident upon the liquid surface of a melt at a predetermined angle. The laser beam reflected from the liquid surface of the melt is detected by means of a detector. However, the liquid surface of the melt fluctuates. This causes the measurement to have an error. Moreover, when the laser beam is reflected from the liquid surface of a melt in the vicinity of a growing single crystal, an error occurs in the measured value of the position of the liquid surface, since the liquid surface of the melt is inclined due to the surface tension with respect to the single crystal.

To eliminate the influence of the fluctuating liquid surface of a melt, according to the method disclosed in Japanese Unexamined Patent Application Publication No. 5-294785, a slit with a small width is set in front of a detector for detecting a laser beam. However, according to this method, the influence of the inclined liquid surface of the melt, which is due to the surface tension with respect to the single crystal, cannot be eliminated. The influence of the inclined liquid surface of the melt becomes greater when the measurement is carried out nearer the single crystal. Therefore, the measurement must be carried out at a position distant from the single crystal. However, in some cases, the measurement is required to be carried out only in the vicinity of the single crystal, depending on the pulling conditions, the structure of the single-crystal-growing apparatus, and so forth. Moreover, the diameter of the single crystal is changed while the single crystal is being pulled. Accordingly, the inclination of the liquid surface is changed. As a result, the measured value of the position of the liquid surface varies. Moreover, it is necessary to provide a furnace with windows for a laser beam on both the projector side and the light-acceptor side of the furnace. Thus, in some cases, it is necessary to modify the structure of the furnace.

Referring to another method, the position of the liquid surface of a melt is measured based on an image of a structure inside a furnace, the image being reflected at the liquid surface of the melt. However, in this case, the above-described influence of the inclined liquid surface cannot be eliminated either. In some cases, the measurement of the liquid surface can be carried out only in the vicinity of the single crystal, depending on the pulling conditions, the structure of the single-crystal-growing apparatus, and so forth. Moreover, the diameter of the single crystal changes as the single crystal is pulled. Accordingly, the inclination of the liquid surface changes. Thus, the measured value varies.

Referring to a method for measuring the position of a liquid surface while eliminating the influence of the inclined liquid surface, it has been proposed that the position of the liquid surface of a melt should be measured based on the central position of the single crystal. Referring to a known method of detecting the central position of a single crystal, the central position is detected based on the position thereof at which a fusion ring formed at the solid-liquid interface between the single crystal and the melt exhibits a maximum diameter (see Japanese Unexamined Patent Application Publication No. 63-238430). According to this method, when the diameter of the single crystal is decreased, the part of the fusion ring which exhibits the maximum diameter is concealed from the grown single crystal. Therefore, when the diameter of the single crystal is decreased, a large error occurs in the measured value. Accordingly, it is necessary that, for determination of the central position of the single crystal, the part of the fusion ring that does not exhibit the maximum diameter should be used. For example, the central position of a single crystal is calculated by approximation of a fusion ring to an ellipse, a circle, or the like in the two-dimensional image thereof according to a least-squares method, a Hough transformation, or the like. However, for the calculation using an approximation, a large number of measurement points are required for higher measurement accuracy. As a result, the amount of calculation increases, and the cost of the measuring device becomes greater.

Japanese Unexamined Patent Application Publication No. 2-102187 proposes a method for measuring the position of a liquid surface without using such an approximation. According to this method, the center of a fusion ring is detected based on the luminance distribution in the horizontal direction of an image. The position of the fusion ring is determined based on the luminance distribution in the vertical direction measured through the detected center of the fusion ring. The distance corresponding to the radius of the single crystal is determined as the peak-to-peak distance in the horizontal direction, based on the position of the fusion ring in the vertical direction. The distance is then corrected. Thus, the position of the center of the single crystal is determined. According to this method, it is required that the side of the fusion ring near a measuring device be entirely observed while the single crystal is being pulled. In some cases, the measurement cannot be carried out, depending on the pulling conditions, the structure of the single crystal growing apparatus, and so forth.

SUMMARY OF THE INVENTION

Accordingly, it is an object of the present invention to provide a device and a method for measuring the position of the liquid surface of a melt with which, even if only a part of a fusion ring can be observed when a single crystal is pulled, the central position of the single crystal can be calculated with a smaller amount of calculation.

According to an aspect of the present invention, there is provided a method of measuring the position of the liquid surface of a melt which includes the steps of: measuring an image of a fusion ring existing in the boundary between a single crystal pulled by a Czochralski method and a melt to detect the central position of the single crystal based on the image, wherein two measuring lines are set in the image of the fusion ring, and the intersections of the respective measuring lines and the fusion ring defined on the opposite sides of the fusion rinq are detected, and the central position of the single crystal is calculated based on the intervals between the intersections defined on the opposite sides of the fusion ring; and determining the position of the liquid surface of the melt based on the detected result.

According to another aspect of the present invention, there is provided a device for measuring the position of the liquid surface of a melt, with which an image of a fusion ring existing in the boundary between a single crystal pulled by a Czochralski method and a melt is measured, the central position of the single crystal is detected based on the image, and the position of the liquid surface of the melt is determined based on the detected result, wherein the device includes: means for setting two measuring-lines in the image of the fusion ring; means for detecting the intersections of the respective measuring-lines and the fusion ring defined on the opposite sides of the fusion ring; and means for calculating the central position of the single crystal based on the intervals between the intersections defined on the opposite sides of the fusion ring.

According to the present invention, even if only a part of the fusion ring can be observed while the single crystal is being pulled, the central position of the single crystal can be calculated with a smaller amount of calculation compared to a known method. Thus, the position of the liquid surface of the melt can be determined with higher accuracy compared to the known method.

Preferably, the measuring lines are defined based on the central position of the seed crystal in a necking process. The measuring lines are used for detection of the central position of the single crystal while the straight body portion of the single crystal is being pulled.

Preferably, thresholds for use in the detection of the intersections of the measuring lines and the fusion ring defined on the opposite sides of the fusion ring are dynamically set based on the average of the peak luminance of the fusion ring in such a manner that the thresholds of the intersections on the right and left hand sides are independent of each other. Thereby, changes in the luminance of the fusion ring, which occur with changes in the thermal conditions in the single-crystal-growing apparatus can be reduced.

Also, preferably, at least two sets each comprising a combination of two measuring lines are defined, and the average of the central positions of the single crystal corresponding to the respective combinations of measuring lines is taken as a measured value of the central position of the single crystal. Thereby, the dispersion due to the measurement error is minimized.

Moreover, preferably, an image-measuring cycle and a time-period for averaging are determined based on the rotational speed of the single crystal rotated while the single crystal is being pulled, and calculated results of the central position of the single crystal obtained during the time-period for averaging are averaged. Thereby, the measurement error which occurs due to influences of lines developed by the crystal habit of the single crystal is minimized, whether the rotational speed of the single crystal is changed or not while the single crystal is being pulled.

DESCRIPTION OF THE PREFERRED EMBODIMENTS

Hereinafter, a device and a method for measuring the position of the liquid surface of a melt provided in an apparatus for pulling a single crystal according to embodiments of the present invention will be described with reference to the accompanying drawings.

Figure 1:
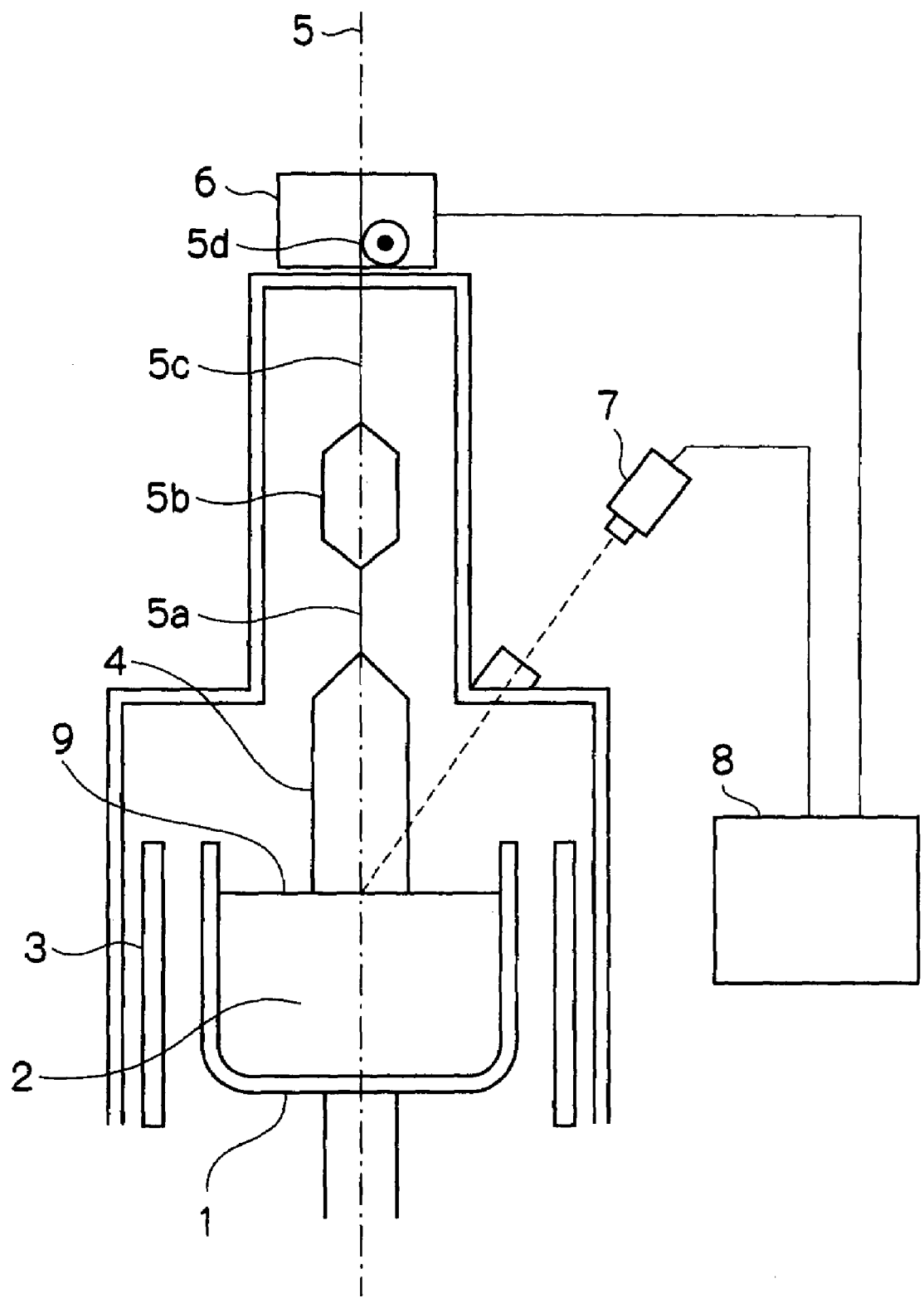
FIG. 1 is a cross-sectional view of a single-crystal-growing apparatus according to an embodiment of the present invention.

FIG. 1 is a schematic cross-sectional view of an apparatus for growing a single crystal which is used to pull the single crystal while the liquid surface of a melt is measured. In FIG. 1, a crucible 1 can be rotated and shifted in the vertical direction. A melt 2, which is raw material for the single crystal, is placed in the crucible 1. A heater 3 is disposed on the outer periphery of the crucible 1. The melt 2 is heated by the heater 3. The single crystal 4 is pulled upward while being rotated, so that the single crystal 4 is grown. A two-dimensional CCD camera 7 is provided, which is used as means for detecting an image of a fusion ring.

The two-dimensional CCD camera 7 may be used not only as means for detecting an image of a fusion ring but also as means for measuring the diameter of a single crystal which is being pulled. Referring to the means of detecting an image of a fusion ring, a method in which a one-dimensional CCD camera is mechanically shifted in the horizontal direction, a method in which an image of a fusion ring is obtained by scanning by changing the measuring angle of a one-dimensional CCD camera, and so forth may be employed in addition to the above-described two-dimensional CCD camera. Also, a processor 8 is shown in FIG. 1, to which data on the rotational speed of a single crystal rotated by means of a rotary device 6 is input from the device 6, and also, to which data on the image of a fusion ring obtained by the two-dimensional CCD camera 7 is input. For example, the processor 8 includes a computer such as a personal computer or the like.

The image data obtained by the two-dimensional CCD camera 7 is distorted, since the camera 7 is set above and in an oblique direction from the single-crystal-growing apparatus. This distortion can be corrected based on a theoretical formula based on geometrical optics calculation. Moreover, the correction may be carried out by use of a correction table which is prepared in advance based on a reference plate having a calibration scale inscribed thereon. In particular, the correction table may be prepared using conversion coefficients which represent distances per pixel in the vertical and horizontal directions of an image.

Figure 2:
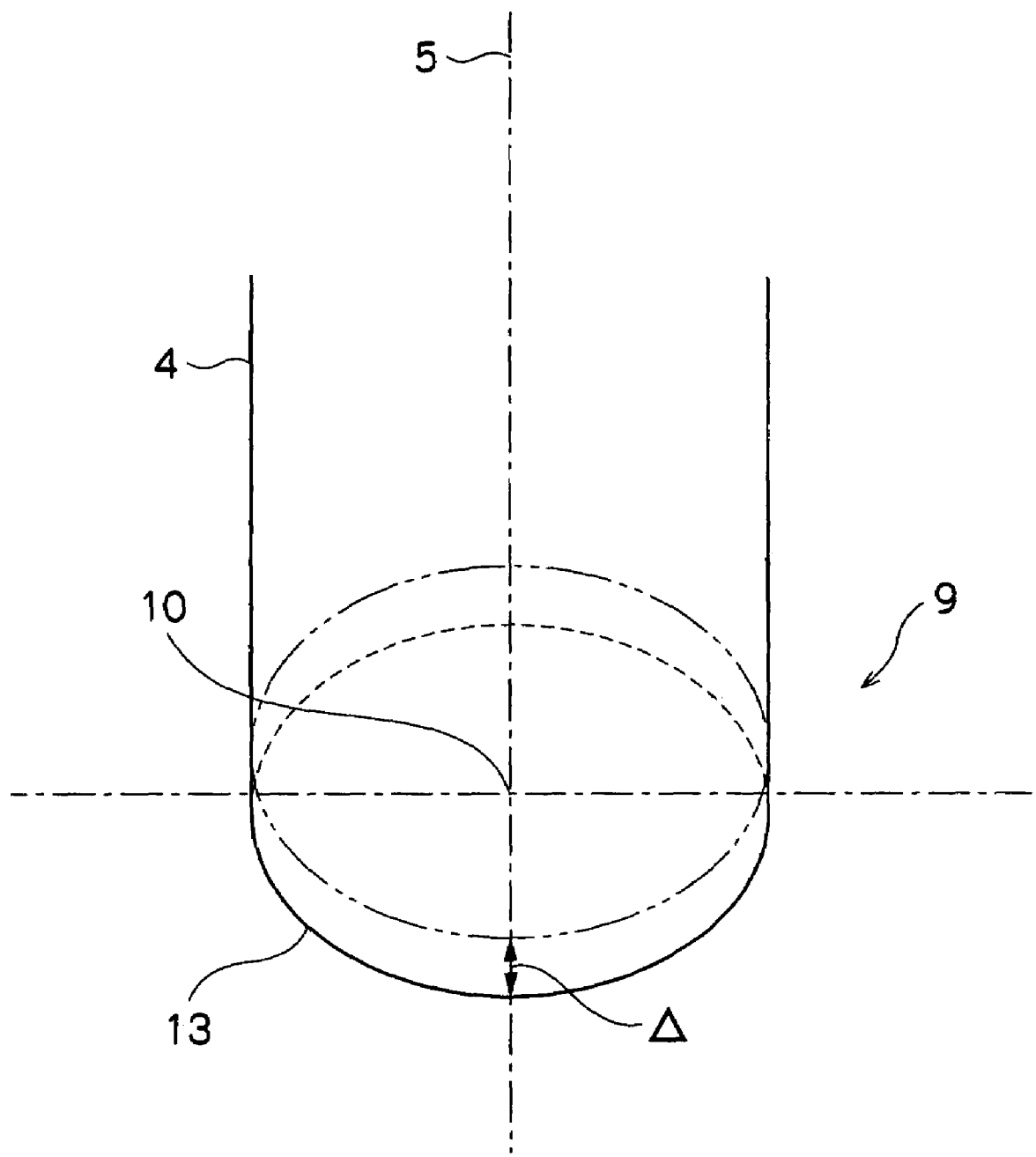
FIG. 2 is a schematic perspective view illustrating the relationship between the central position of a single crystal and the position of the liquid surface of a melt.

According to this embodiment, a fusion ring 13 is detected to obtain the two-dimensional image date thereof, as shown in FIG. 2. Thereafter, the position of the center 10 of a single crystal is calculated according to the method described below, and thus, the position of the liquid surface 9 of the melt is measured. The above-described measuring operation is executed by the processor 8. The processor 8 and the two-dimensional CCD camera 7 constitute a device for measuring the position of a liquid surface.

FIG. 2 shows a fusion ring 13a depicted in a broken long line and two short dashes line. The liquid surface of the fusion ring 13a is higher by Δ than that of the fusion ring 13.

A method for measuring the position of the liquid surface of a melt is described with reference to FIGS. 3 and 4. In this case, the method is carried out by use of a single-crystal-growing apparatus having such a constitution as shown in FIG. 1. First, two-dimensional image data of the fusion ring 13 is obtained by means of the two-dimensional CCD camera 7 (S100). The processing includes the correction of distortion which is generated due to the image capturing direction being oblique to the liquid surface.

If the position of the liquid surface 9 of the melt is low, the position of the fusion ring 13 is also low. On the other hand, if the position of the liquid surface 9 of the melt is high, the position of the fusion ring 13 is also high. Therefore, the image data of the fusion ring 13, obtained by image-capturing with the stationary two-dimensional CCD camera 7, becomes data of an image shifted mainly in the Y-direction in FIG. 3, corresponding to the shifted position of the liquid surface 9. That is, the center 10 of the fusion ring 13 in the Y-direction is changed corresponding to the position of the liquid surface 9 of the melt. The position in the X-direction of the center 10 of the fusion ring 13 is constant, irrespective of the position of the liquid surface 9 of the melt, since the image data obtained by means of the two-dimensional CCD camera 7 is not shifted in the right and left direction.

Subsequently, two measuring lines 11 and 12 are set in the obtained two-dimensional image data of the fusion ring 13 (S101). When the diameter of the single crystal 4 is decreased, the fusion ring 13 will be concealed behind the single crystal 4 grown on the upper side of the fusion ring 13. Thus, the center 10 of the single crystal cannot be detected using the measuring line 11 if it is set near the center 10 of the single-crystal. Thus, the measuring line 11 is set on the surface side of the center 10 of the single crystal, that is, at a position lower than the center 10 of the single crystal in the image of the fusion ring. In this case, the position of the center 10 of the single crystal, as a reference, is the central position of an image captured by the two-dimensional CCD camera 7 while a seed crystal 5a is pulled in a necking process. The other measuring line 12 is set on the surface side with respect to the measuring line 11 and relatively near to the two-dimensional CCD camera 7, i.e., on the lower side of the measuring line 11 in the captured image.

Subsequently, the intersections C1, C1, and C2, C2, intersections of the measuring lines 11 and 12 and the fusion ring 13 on the opposite sides of the fusion ring, are detected (S102). Thresholds for use in detection of these intersections are dynamically set based on the corrected averages of the peak luminance of the fusion ring in an image thereof in such a manner that the thresholds on the right and left hand sides in the image are independent of each other. The right and left sides of the image are determined with respect to the position of the seed crystal taken when the seed crystal is pulled. The above-described setting can cope with changes in luminance of the fusion ring which occur due to changes in thermal conditions in the single-crystal-growing apparatus.

Figure 3:
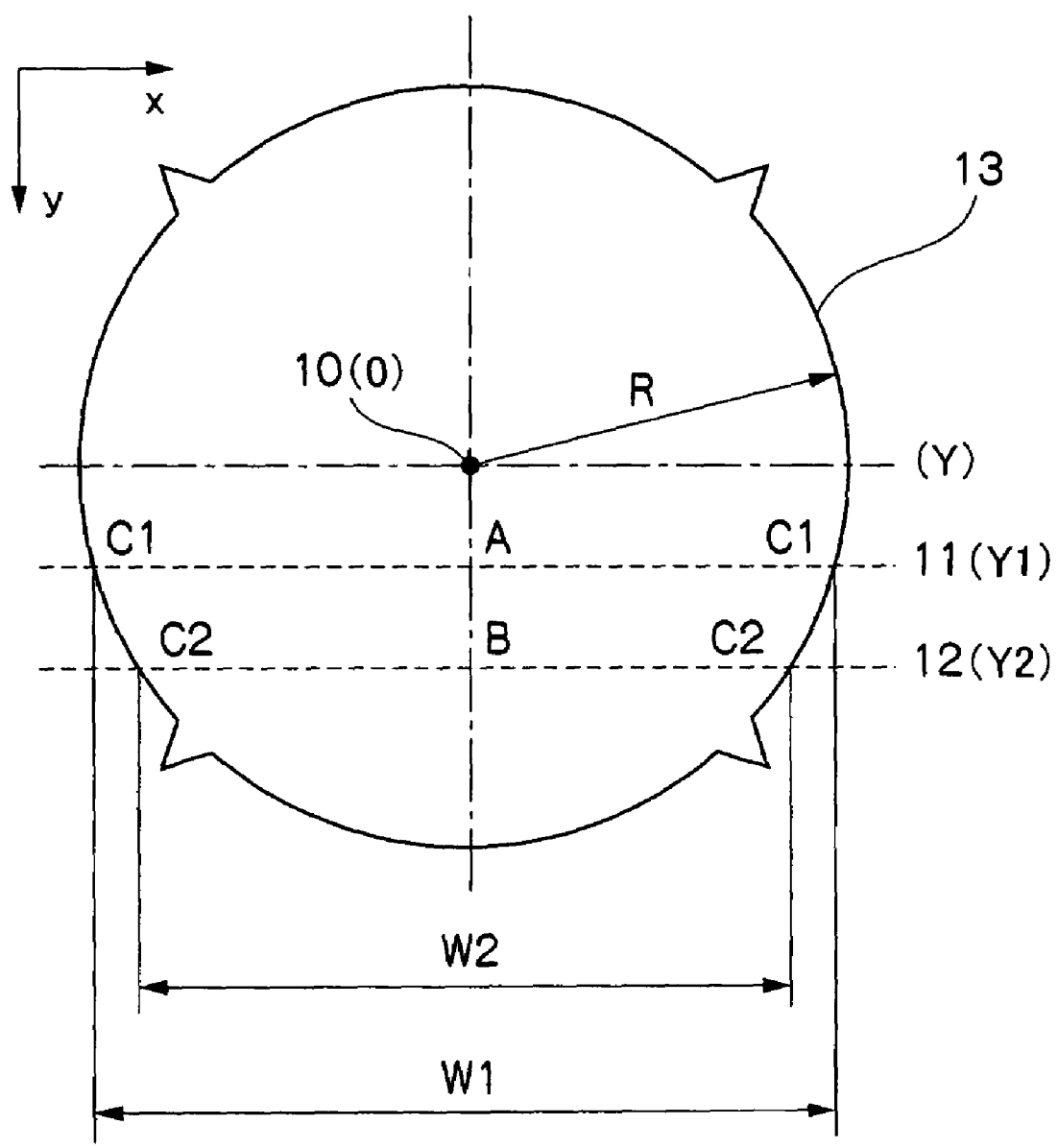
FIG. 3 is a schematic view illustrating a method for setting measuring lines based on a two-dimensional image of a fusion ring according to an embodiment of the present invention.
Figure 4:
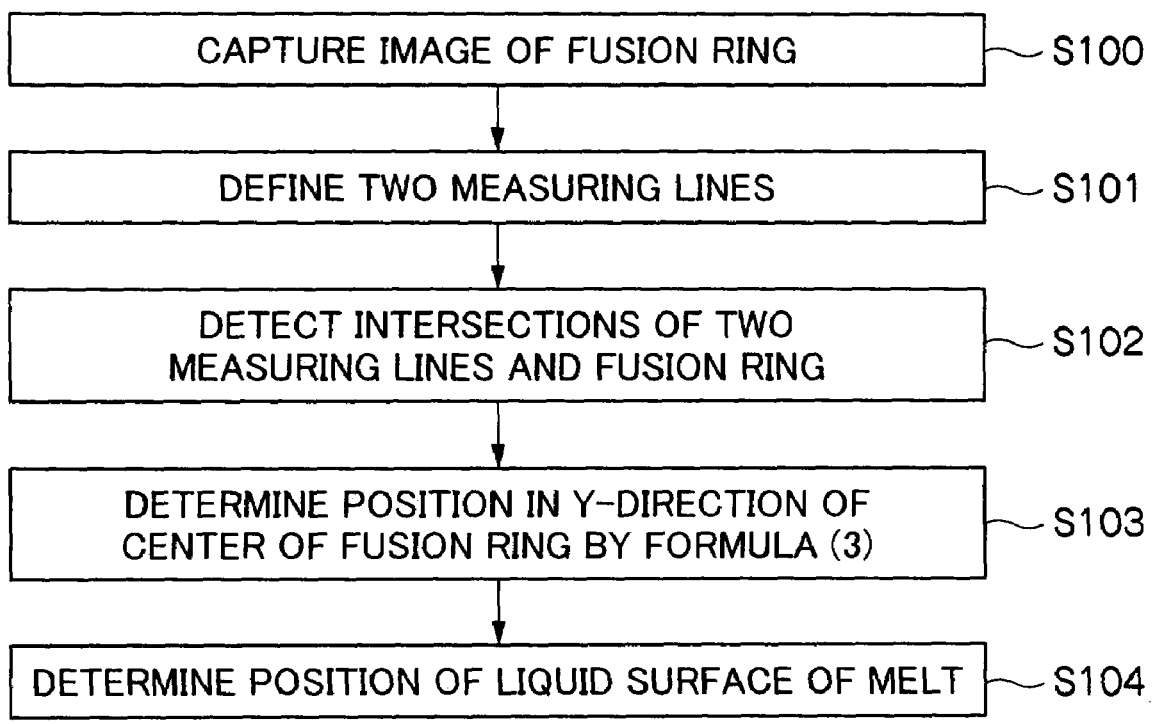
FIG. 4 is a flow chart showing steps for measuring the position of the liquid surface of a melt according to an embodiment of the present invention.

Referring to FIG. 3, right-angled triangles OAC1 and OBC2 have the relationships represented by formulae (1) and (2);

$$R^2 = (W1/2)^2 + (Y-Y1)^2 \qquad (1)$$

$$R^2 = (W2/2)^2 + (Y-Y2)^2 \qquad (2)$$

in which W1 and W2 represent the intervals between the intersections of the two measuring lines 11 and 12 and the fusion ring defined on both sides of the fusion ring, respectively; Y, Y1 and Y2 represent the position of the center of the single crystal, that of the measuring line 11, and that of the measuring line 12 in the y-direction, respectively; and R represents the radius of the fusion ring.

The position Y in the y-direction of the center 10 of the single crystal in the two-dimensional image can be expressed by formula (3) in which all of the values are known, derived from the relationships represented by the formulae (1) and (2). That is, the position Y in the y-direction of the center 10 of the single crystal in the two-dimensional image is determined according to the formula (3) (S103).

$$Y = \{Y1 + Y2 + (W1^2 - W2^2)/4(Y1-Y2)\}/2 \qquad (3)$$

The position Y in the y-direction of the center 10 of the single crystal, determined as described above, may be taken as a value representing the center of the liquid surface 9 of the melt, and the succeeding process is carried out using this value. Preferably, a conversion table or a conversion formula regarding the position Y and the position of the liquid surface 9 of the melt are prepared in advance, and the position Y is converted to the position of the liquid surface 9 of the melt (S104).

The above-described steps S100 to S104 may be carried out by use of software. Some or all of the steps may be carried out using processing means exclusively used for the steps.

Moreover, at least two sets each comprising a combination of the above-described two measuring lines may be defined. The positions of the center of the single crystal determined using the respective sets are then averaged, and the average is taken as the position of the center of the single crystal. According to this method, the dispersion of the position Y, occurring due to the measurement error, can be minimized. For example, a total of four measuring lines may be provided, and two sets each comprising two measuring lines of the four measuring lines are defined. Alternatively, a total of three measuring lines may be provided, and two sets each comprising two measuring-lines, one of the two lines is shared between the two sets, are defined.

Moreover, referring to the above-described method of measuring the position of the liquid surface of the melt, when the cross-section of the single crystal has an exact circular shape, the measurement error is very small. However, the cross-section of a single crystal while it is being pulled is not exactly circular. The deformation of the single crystal becomes large, depending on the pulling conditions. Thus, in some cases, the measurement error becomes large. Moreover, if a line developed by the crystal habit of the single crystal appears on a measuring line, measurement error occurs in the relevant portion of the measuring line. Thus, the measurement error becomes large for the measuring line on which the line developed by the crystal habit appears. Thus, a measured value obtained using the measuring-line on which the line developed by the crystal habit appears is different from that obtained in the part of the fusion ring where the line developed by the crystal habit does not appear on the measuring line. Therefore, for reduction of the influence of the measurement error caused by the line developed by the crystal habit, it is necessary to average the measured values.

In the case of a (100) single crystal, four crystal habit lines are generated at intervals of 90 degrees. If the rotational speed of the single crystal is 15 rpm, the lines by the crystal habit appear at the same positions, respectively. Therefore, when the measuring cycle is set at 1 second, all measured values have an error which occurs due to the line by the crystal habit. In most cases, a single crystal is hung in a CZ furnace from the upper portion thereof by means of a wire. Therefore, in some cases, an error occurs in the rotational angle of the single crystal while the single crystal is being pulled, due to the twisting of the wire.

Moreover, in some cases, the single crystal itself is distorted depending on the thermal conditions in the single-crystal-growing apparatus. Therefore, if the relationship between the rotational speed of the single crystal and the measuring cycle is not appropriate, the line developed by the crystal habit will exert influences over the measurement in some portion of the fusion ring, and have no influences over the measurement in the other portion of the fusion ring while the straight-body portion of the single crystal is being pulled. Thus, the measured value varies. Moreover, in the case in which the rotational speed of the single crystal is changed while the straight-body portion of the single crystal is being pulled, there is an influence of the line developed by the crystal habit on the measurement due to the change of the rotational speed. Therefore, it is necessary to set the measuring cycle and the time-period for averaging, so that the influence of the line developed by the crystal habit on the measurement becomes constant in correspondence to the rotational speed of the single crystal while the single crystal is being pulled. To average the influence of the line by the crystal habit during the time-period for averaging, it is necessary to appropriately set the rotational speed of the single crystal during the measuring cycle. Thus, it is necessary to appropriately set the rotational angle of the single crystal appropriately during the measuring cycle.

The measuring cycle p (S) and the time period t (S) for averaging can be calculated according to formulae/ (4) and (5):

$$p=(60/r)/(360/\theta) \qquad (4)$$

$$t=p \times n \qquad (5)$$

in which n represents the number of measurements, r represents the rotational speed of the single crystal, and $\theta$ represents the rotational angle (deg.) of the single crystal during a predetermined measuring cycle.

The measurement is carried out during the measuring cycle p (S) calculated according to formula (4). The measured values obtained within the time-period t (S) for averaging are averaged. Thereby, the measurement error due to the influence of lines developed by the crystal habit can be kept constant, independent of changes in the rotational speed of the single crystal occurring while the single crystal is being pulled.

The method of measuring the position of the liquid surface of a melt according to an embodiment of the present invention was carried out. Thus, the position of the liquid surface was measured. The results will be described below.

A single-crystal-growing apparatus having such a constitution as shown in FIG. 1 was used. Two-dimensional image data of a fusion ring was obtained by means of a two-dimensional CCD camera 7. Subsequently, two measuring lines 11 and 12 were set in the two-dimensional image data of the fusion ring, as shown in FIG. 3. The measuring line 11 was set relatively near the center 10 of the single crystal and on the surface side of the center 10 of the single crystal, that is, at a position about 20 mm lower than the center of the single crystal in the image. In this case, the position of the center 10 of the single crystal, which was a reference position, was the center of the image taken with the two-dimensional CCD camera while the seed crystal 5a was being pulled in a necking process. The other measuring line 12 was set on the surface side of the measuring line 11, that is, at a position about 20 mm lower than the measuring line 11.

Thresholds for use in detection of the intersections of the measuring lines 11 and 12 and the fusion ring, defined on the opposite sides of the fusion ring, were dynamically set based on the averages of the peak luminance of the fusion ring in the image, the averages being multiplied by a coefficient of 0.9 for correction, in such a manner that the thresholds on the left and right hand sides in the image were independent of each other. The above-described method could cope with changes in the luminance of the fusion ring, which occurred with changes in the thermal conditions of the single-crystal-growing apparatus, the changes being caused by the pulling of the single crystal.

The position of the center 10 of the single crystal was calculated from formula (3). Twenty sets each comprising a combination of two measuring lines 11 and 12 were set at a pitch of 1 mm. The central positions of the single crystal measured correspondingly to the respective combinations of the measuring lines were averaged. The average was taken as the central position of the single crystal. According to this way, the dispersion occurring due to the measurement error could be minimized.

The rotational angle of the single crystal rotated during the measuring cycle was set at 68 degrees, and the number of measurements during the measuring cycle was set at 90. The rotational speed of the single crystal was set in the range of 5 rpm to 20 rpm. When the single crystal was pulled under these conditions, the measurement error due to the influence of lines developed by the crystal habit of the single crystal could be kept constant, even though the rotational speed of the single crystal was changed. The time-period for averaging was in the range of about 25 seconds to 200 seconds. Thus, the position of the liquid surface could be measured at least one time for 4 minutes. If the rotational speed of the single crystal is small, the measuring time can be reduced by changing the rotational angle to 34 degrees or 17 degrees.

In the case of a single crystal (100), any angle excluding the common divisors and the common multiples of the angular interval (90 deg.) of the lines developed by the crystal habit may be selected as the rotational angle of the single crystal rotated during the measuring cycle. The rotational angle is not restricted to the above-mentioned values.

Figure 5:
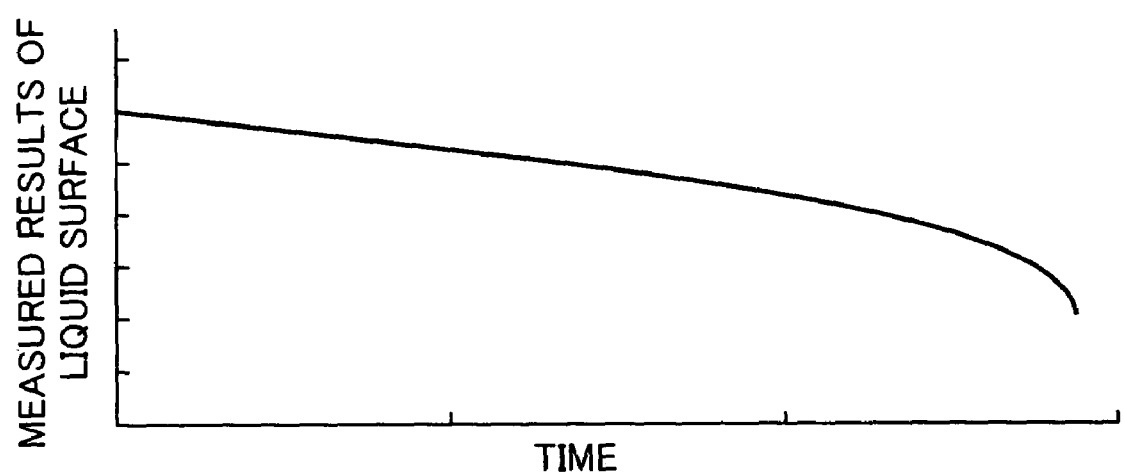
FIG. 5 is a graph showing measured results in the position of the liquid surface of a melt, which are obtained by the method for setting measuring-lines based on a fusion ring according to the embodiment of the present invention.
Figure 6:
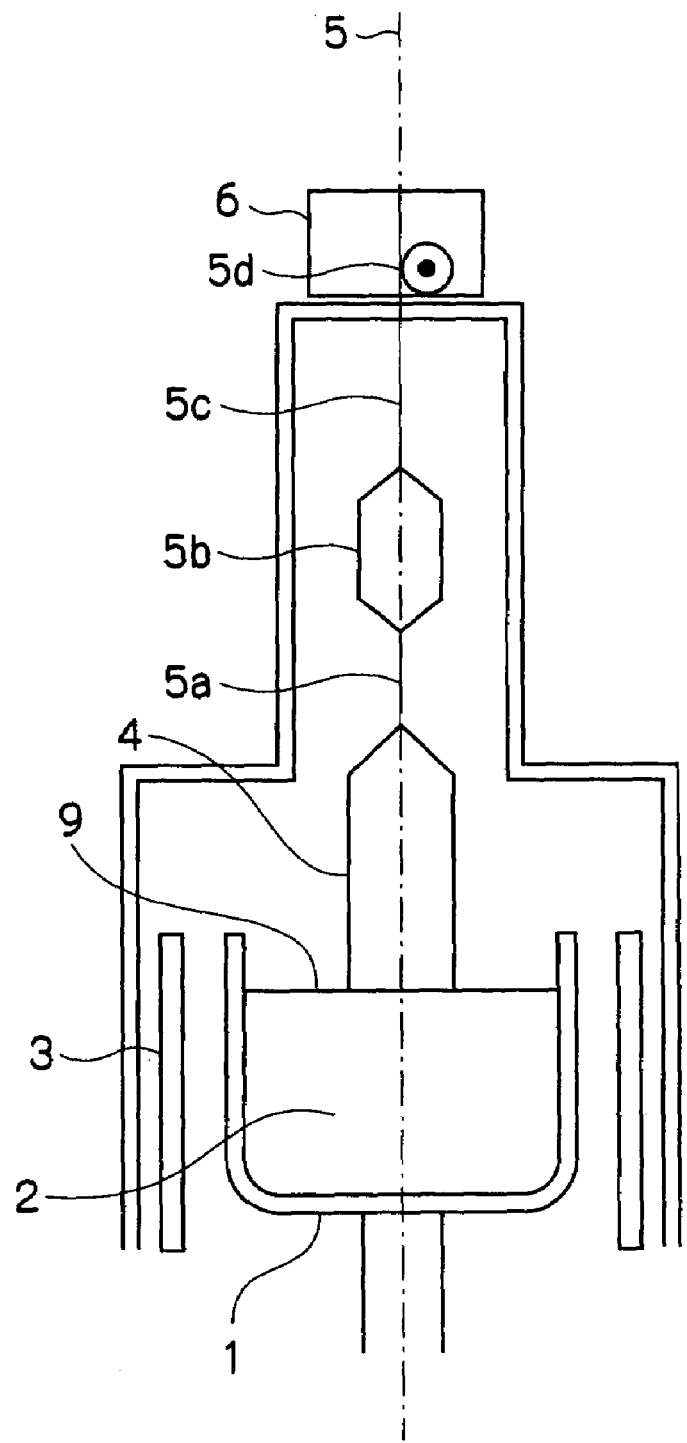
FIG. 6 is a schematic cross-sectional view of an apparatus for growing a single crystal according to a known CZ method.

FIG. 5 shows the measured results of the position of the liquid surface of a melt obtained according to this Example. As shown in FIG. 5, the position of the liquid surface of a melt taken while the single crystal was being pulled could be accurately measured. Thus, the position of the liquid surface of the melt can be controlled with high accuracy while the single crystal is being pulled.

Moreover, even if only a part of a fusion ring can be observed when the single crystal is pulled, the central position of the single crystal can be calculated with a smaller amount of calculation compared to that calculated by a known method, provided that at least one set of measuring lines to give the intersections can be set. Thus, it is possible to measure the position of the liquid surface of the melt with higher accuracy compared to that of a known method.

What is claimed is:

1. A method for measuring the position of a liquid surface of a melt from which a single crystal is pulled by a Czochralski method, the method comprising:
    capturing an image of a fusion ring at a boundary between the single crystal and the melt;
    setting a first measuring line across the captured image below a central reference point in the captured image;
    setting a second measuring line across the captured image spaced below and parallel to the first measuring line;
    detecting the positions in the captured image of intersections of the respective measuring lines and the fusion ring defined on opposite sides of the fusion ring and determining the interval between the intersections on each measuring line;
    calculating the center of the fusion circle based on the detected positions of the intersections of the respective measuring lines and the determined intervals between the intersections for each measuring line; and
    determining the position of the liquid surface of the melt based on the calculated center of the fusion circle.

2. The method for measuring the position of the liquid surface of the melt according to claim 1, wherein the central reference point is a central position of a seed crystal used in a necking process.

3. The method for measuring the position of the liquid surface of the melt according to claim 1, wherein thresholds for use in the detection of the intersections of the measuring lines and the fusion ring defined on the opposite sides of the fusion ring are dynamically set based on an average of a peak luminance of the fusion ring in such a manner that the thresholds of the intersections on the right and left hand sides in the image thereof are independent of each other.

4. The method for measuring the position of the liquid surface of a melt according to claim 1, wherein at least two sets each comprising a combination of two measuring lines are defined, and an average of the central positions of the single crystal corresponding to the respective combinations is taken as the calculated center of the fusion circle.

5. The method for measuring the position of the liquid surface of the melt according to claim 1, wherein an image-measuring cycle and a time-period for averaging are determined based on a rotational speed of the single crystal rotated while the single crystal is being pulled, and the calculated positions for the center of the fusion circle, obtained during the time-period for averaging, are averaged.

6. A device for measuring a position of a liquid surface of a melt, from which a single crystal is pulled by a Czochralski method, with a fusion ring existing at a boundary between the single crystal and the melt, wherein the center of the fusion ring is calculated based on the image, and the position of the liquid surface of the melt is determined based on the calculated center of the fusion ring, the device comprising:
    means for capturing an image of the fusion ring;
    means for setting at least two spaced apart measuring lines across the captured image of the fusion ring below a central reference point in the captured image;
    means for detecting the intersections of the respective measuring lines and the fusion ring, the intersections being located on the opposite sides of the fusion ring; and
    means for calculating the center of the fusion ring based on the intervals between the intersections on the opposite sides of the fusion ring.

7. The device for measuring the position of the liquid surface of the melt according to claim 6, wherein the means for setting measuring lines sets the measuring lines based on the central position of a seed crystal in a necking process.

8. The device for measuring the position of the liquid surface of the melt according to claim 6, wherein the means for detecting intersections dynamically sets thresholds for use in the detection of the intersections of the measuring lines and the fusion ring defined on the opposite sides of the fusion ring, based on the average of a peak luminance of the fusion ring in such a manner that the thresholds of the intersections on right and left hand sides are independent of each other.

9. The device for measuring the position of the liquid surface of the melt according to claim 6, wherein the means for setting measuring lines defines at least two sets each comprising a combination of two measuring lines, the means for detecting intersections detects all of the intersections of the measuring lines, and the means for calculating the center of the fusion ring averages values for the center of the fusion ring calculated for each of respective combinations of measuring lines.

10. The device for measuring the position of the liquid surface of the melt according to claim 6, wherein the means for calculating the center of the fusion ring determines an image measuring cycle and a time period for averaging based on a rotational speed of the single crystal rotated while the single crystal is being pulled, and averages the calculated results for the center of the fusion ring obtained during the time period for averaging.

11. The method for measuring the position of the liquid surface of the melt according to claim 1, wherein the center of the fusion ring is calculated according to the following formula:

$$Y = \{Y1 + Y2 + (W1^2 - W2^2)/4(Y1 - Y2)\}/2$$

wherein:
- a vertical line through the reference point defines a Y-axis;
- Y is the Y-axis position of the center of the fusion ring;
- Y1 is the Y-axis position of the first measuring line;
- Y2 is the Y-axis position of the second measuring line;
- W1 is the interval between the intersections on the first measuring line; and
- W2 is the interval between the intersections on the second measuring line.

12. The device for measuring position of the liquid surface of the melt according to claim 6 wherein the means for capturing an image of the fusion ring is a stationary two-dimensional COD camera.

* * * * *

UNITED STATES PATENT AND TRADEMARK OFFICE
CERTIFICATE OF CORRECTION

PATENT NO. : 7,172,656 B2 Page 1 of 1
APPLICATION NO. : 10/822662
DATED : February 6, 2007
INVENTOR(S) : Takanashi et al.

It is certified that error appears in the above-identified patent and that said Letters Patent is hereby corrected as shown below:

TITLE PAGE, ITEM (54) "OR" should read -- OF --.

Column 12, line 8 (claim 12, line 4) "COD" should read -- CCD --.

Signed and Sealed this

Fifth Day of June, 2007

JON W. DUDAS
*Director of the United States Patent and Trademark Office*